(12) United States Patent
Farooq et al.

(10) Patent No.: US 10,636,759 B2
(45) Date of Patent: Apr. 28, 2020

(54) METHODS OF FORMING INTEGRATED CIRCUIT STRUCTURE FOR JOINING WAFERS AND RESULTING STRUCTURE

(71) Applicant: GLOBALFOUNDRIES INC., Grand Cayman (KY)

(72) Inventors: Mukta G. Farooq, Hopewell Junction, NY (US); Tanya A. Atanasova, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/106,239

(22) Filed: Aug. 21, 2018

(65) Prior Publication Data
US 2020/0066667 A1 Feb. 27, 2020

Related U.S. Application Data

(62) Division of application No. 15/420,362, filed on Jan. 31, 2017, now Pat. No. 10,103,119.

(51) Int. Cl.
*H01L 23/48* (2006.01)
*H01L 23/52* (2006.01)
(Continued)

(52) U.S. Cl.
CPC ............. *H01L 24/13* (2013.01); *H01L 24/16* (2013.01); *H01L 24/05* (2013.01); *H01L 2224/0401* (2013.01); *H01L 2224/13013* (2013.01); *H01L 2224/13014* (2013.01); *H01L 2224/1355* (2013.01); *H01L 2224/1369* (2013.01); *H01L 2224/13083* (2013.01); *H01L 2224/13147* (2013.01); *H01L 2224/13155* (2013.01); *H01L 2224/13564* (2013.01); *H01L 2224/13576* (2013.01); *H01L 2224/13611* (2013.01); *H01L 2224/13639* (2013.01); *H01L 2224/13647* (2013.01); *H01L 2224/16145* (2013.01)

(58) Field of Classification Search
CPC ..... H01L 2224/81191; H01L 21/76843; H01L 2224/13083; H01L 2224/16238
USPC ......................................... 257/750, 780, 781
See application file for complete search history.

(56) References Cited

U.S. PATENT DOCUMENTS

| | | | |
|---|---|---|---|
| 6,940,169 B2 | 9/2005 | Jin et al. | |
| 7,081,680 B2 * | 7/2006 | Edelstein | H01L 21/288 257/779 |

(Continued)

OTHER PUBLICATIONS

Office Action and English Translation thereof for Taiwanese Patent Application No. 10720998890 dated Oct. 25, 2018, 13 pages.
(Continued)

*Primary Examiner* — S. V. Clark
(74) *Attorney, Agent, or Firm* — Anthony Canale; Hoffman Warnick LLC

(57) ABSTRACT

The disclosure is directed to an integrated circuit structure for joining wafers. The IC structure may include: a metallic pillar over a substrate, the metallic pillar including an upper surface; a wetting inhibitor layer about a periphery of the upper surface of the metallic pillar; and a solder material over the upper surface of the metallic pillar, the solder material being within and constrained by the wetting inhibitor layer. The sidewall of the metallic pillar may be free of the solder material.

19 Claims, 8 Drawing Sheets

(51) Int. Cl.
*H01L 29/40* (2006.01)
*H01L 23/00* (2006.01)

(56) References Cited

U.S. PATENT DOCUMENTS

| | | | |
|---|---|---|---|
| 7,323,406 | B2 | 1/2008 | Lim et al. |
| 7,888,754 | B2 * | 2/2011 | Omura ................ B81B 3/0021 |
| | | | 257/419 |
| 8,637,392 | B2 | 1/2014 | Arvin et al. |
| 8,823,167 | B2 * | 9/2014 | Wu ................ H01L 23/49811 |
| | | | 257/737 |
| 9,142,521 | B2 | 9/2015 | Chang |
| 9,190,376 | B1 | 11/2015 | Arvin et al. |
| 9,324,669 | B2 | 4/2016 | Arvin et al. |
| 9,437,563 | B2 * | 9/2016 | Kim ........................ H01L 24/11 |
| 9,613,921 | B2 * | 4/2017 | Daubenspeck ......... H01L 24/11 |
| 2005/0026413 | A1 | 2/2005 | Lee et al. |
| 2012/0091577 | A1 | 4/2012 | Hwang et al. |
| 2016/0322322 | A1 | 11/2016 | Utsunomiya |
| 2016/0329288 | A1 * | 11/2016 | Chopin ................... H01L 24/02 |
| 2017/0077052 | A1 * | 3/2017 | Mariottini ............... H01L 24/05 |

OTHER PUBLICATIONS

U.S. Appl. No. 15/420,362, Office Action dated Jan. 9, 2018, 14 pages.
U.S. Appl. No. 15/420,362, Notice of Allowance dated Jul. 10, 2018, 7 pages.

* cited by examiner

US 10,636,759 B2

METHODS OF FORMING INTEGRATED CIRCUIT STRUCTURE FOR JOINING WAFERS AND RESULTING STRUCTURE

BACKGROUND

Technical Field

The present disclosure relates to integrated circuit structures, and more particularly to methods of forming integrated circuit structures for joining wafers including metallic pillars having solder material thereover wherein a sidewall of the metallic pillar is free of the solder material, and resulting structures.

Related Art

One conventional approach for joining individual chips to packaging substrates is collapsible controlled chip connection (C4), also referred to as solder ball (or solder bump) packaging. This interconnect packaging uses solder balls to form both physical and electrical connections between the wafers. Another conventional approach includes pillar interconnect structures on one wafer to join another wafer. Pillar interconnect structures have been found to be advantageous when compared to solder ball packaging due to the enhancement of electromigration performance. Additionally, pillar interconnect structures allow for tighter pitch between the pillar interconnect structures compared to the pitch between solder balls that melt completely during the joining process. In the pillar interconnect technology, a small amount of solder may still be used over the pillar. However, one difficulty with this technology is that solder wetting to the sidewalls of the pillar interconnect structure may occur. The sidewall wetting can cause solder bridging or shorting between adjacent pillar interconnect structures. Further, sidewall wetting may cause additional losses during wafer fabrication and service life.

SUMMARY

A first aspect of the disclosure is directed to an integrated circuit structure for joining wafers. The integrated circuit structure may include: a metallic pillar over a substrate, the metallic pillar including an upper surface; a wetting inhibitor layer about a periphery of the upper surface of the metallic pillar; and a solder material over the upper surface of the metallic pillar, the solder material being within and constrained by the wetting inhibitor layer.

A second aspect of the disclosure is directed to a method of forming an integrated circuit structure for joining wafers. The method may include: forming a metallic pillar over a substrate, the metallic pillar having an upper surface; forming a wetting inhibitor layer about a periphery of the upper surface of the metallic pillar; and forming a solder material over the upper surface of the metallic pillar within and constrained by the wetting inhibitor layer.

A third aspect of the disclosure is directed to an integrated circuit structure for joining wafers. The integrated circuit structure may include: a metallic pillar over a substrate, the metallic pillar including an upper surface; a wetting inhibitor layer about a periphery of the upper surface of the metallic pillar, the wetting inhibitor layer defining an annular ring or a polygonal frame over the metallic pillar; and a solder material over the upper surface of the metallic pillar, the solder material being within and constrained by the wetting inhibitor layer, wherein a sidewall of the metallic pillar is free of the solder material.

A fourth aspect of the disclosure is directed to an integrated circuit structure for joining wafers. The integrated circuit structure may include: a metallic pillar over a substrate, the metallic pillar including an upper surface; a wetting inhibitor layer about a periphery of the upper surface of the metallic pillar, the wetting inhibitor layer defining an annular ring or a polygonal frame over the metallic pillar, the wetting inhibitor layer including: a width of approximately 2.0 micrometers ($\mu$m) to approximately 6.0 $\mu$m; a periphery with a first thickness; and an inner edge with a second thickness, wherein the first thickness is greater than the second thickness; and a solder material over the upper surface of the metallic pillar, the solder material being within and constrained by the wetting inhibitor layer and the solder material including a top surface having a substantially convex shape, wherein a sidewall of the metallic pillar is free of the solder material.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to integrated circuit structures, and more particularly to methods of forming integrated circuit structures for joining wafers including metallic pillars having solder material thereover wherein a sidewall of the metallic pillar is free of the solder material, and resulting structures. Specifically, the integrated circuit structures according to the present disclosure include a wetting inhibitor layer about the periphery of the upper surface of the metallic pillar thereby defining a frame or a ring over the metallic pillar such that the solder material over the metallic pillar is within and constrained by the wetting inhibitor layer. As a result, there is no overflow of solder along the sidewalls of the metallic pillar. In contrast to conventional integrated circuit structures, the present disclosure inhibits solder sidewall runoff by modifying the top surfaces of the metallic pillar instead of creating a hydrophobic or non-wettable metallic pillar sidewall.

Figure 1:
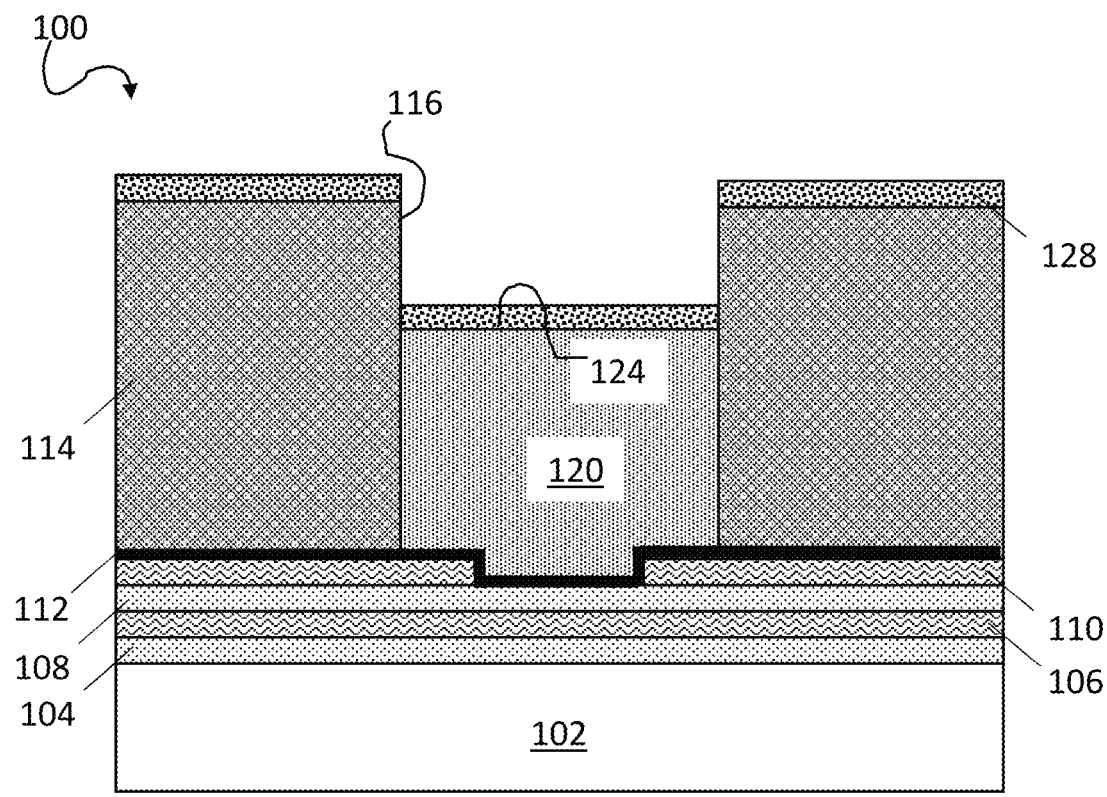
FIGS. 1-5 show cross-sectional views of an integrated circuit structure according to embodiments of the disclosure.

FIG. 1 shows a cross-sectional view of a preliminary integrated circuit (IC) structure 100 according to embodiments of the disclosure. IC structure 100 may include a substrate 102. Substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of substrate 102 may be strained. While substrate 102 is shown as including a single layer of semiconductor material, it is emphasized that the teachings of the disclosure are equally applicable to semiconductor-on-insulator (SOI) substrates. As known in the art, SOI substrates may include a semiconductor layer on an insulator layer on another semiconductor layer (not shown). The semiconductor layers of an SOI substrate may include any of the semiconductor substrate materials discussed herein. The insulator layer of the SOI substrate may include any now known or later developed SOI substrate insulator such as but not limited to silicon oxide.

Overlying substrate 102 may be a conductive layer 104, an insulator layer 106, another conductive layer 108, and another insulator layer 110. More specifically, conductive layer 104 may be disposed over substrate 102. Conductive layer 104 may include any now know or later discovered conductive material, e.g., copper. Insulator layer 106 may be disposed over conductive layer 104. Insulator layer 106 may include any now know or later developed insulator layer, e.g., an oxide or a nitride. Conductive layer 108 may be disposed over insulator layer 106. Conductive layer 108 may include conductive pads (not shown), e.g., of aluminum or copper. The conductive pads may be connected to conductive layer 104 by vias (not shown) that are disposed within insulator layer 106. A passivation layer 110 may be disposed over conductive layer 108. Passivation layer 110 may include several layers (not individually shown), such as for example, an optional polymer planarization layer overlying a nitride layer overlying an oxide layer. Layers 104, 106, 108, 110 may each be formed by deposition.

"Depositing" or "deposition" as used herein, may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

A portion of passivation layer 110 may be removed, e.g., by etching, to expose a portion of conductive layer 108 thereunder. As used herein, "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches. Further, an under bump metallization (UBM) layer 112 may be formed, e.g., conformally deposited, over passivation layer 110 and exposed conductive layer 108. While UBM layer 112 is shown as a single layer, it is to be understood that UBM layer 112 may include a two layers including a barrier layer, e.g., titanium or titanium tungsten, and a seed layer, e.g., copper. In some embodiments, another conductive layer (not shown), e.g., including nickel, may be formed over UBM layer 112. As known in the art, UBM layer 112 aids in electroplating the metallic pillar as will be described herein.

A photoresist 114 may be formed, e.g., by depositing, over UBM layer 112. Further, photoresist 114 may undergo conventional lithographic and etching processes to form an opening 116 within photoresist 114 that exposes the exposed portion of UBM layer 112 as shown in FIG. 1. A metallic pillar 120 may be formed within opening 116. Metallic pillar 120 may include, for example, copper, nickel, or combinations thereof. As used herein "metallic pillar" may refer to a pillar including a single metal, multiple metals, or alloys thereof. Metallic pillar 120 may be formed using conventional deposition and/or electroplating techniques such that metallic pillar 120 is constrained within opening 116 within photoresist 114. While metallic pillar 120 has been shown as a single layer, it is to be understood that metallic pillar 120 may be comprised of more than one layer, for example, a layer of copper, overlying a layer of nickel, overlying another layer of copper. Metallic pillar 120 may be substantially cylindrical in shape such that an upper surface of metallic pillar 120 is substantially circular or ovular. In other embodiments, metallic pillar 120 may have a polygonal shaped upper surface. As shown in FIG. 1, metallic pillar 120 may be in electrically connected to conductive layer 108 via UBM layer 112. Metallic pillar 120 may have a height that is less than a height of photoresist 114. Metallic pillar 120 may include a micro-pillar having a diameter of approximately 25 micrometers (μm), however, embodiments described herein are not so limited and are equally applicable to metallic pillar 120 having a diameter that is larger or smaller than 25 μm. In such a situation, dimensions, e.g., heights, widths, and thicknesses, discussed herein can be modified accordingly based on the size of the metal pillar used. As used herein "approximately" is intended to include values, for example, within 10% of the stated values.

Still referring to FIG. 1, a wetting inhibitor layer 128 may be formed, e.g., deposited, over an upper surface 124 of metallic pillar 120. As shown, wetting inhibitor layer 128 may also be formed over an upper surface (not individually labeled in FIG. 1) of photoresist 114. Wetting inhibitor layer 128 may include any now known or later developed dielectric material, such as for example a material containing at least one of: silicon, oxygen, carbon, nitrogen, or hydrogen, and combinations thereof. In one example, wetting inhibitor layer 128 may include an oxide, e.g. silicon oxide, a nitride, e.g., silicon nitride, or combinations thereof. However, it is to be understood that dielectrics without at least one of: silicon, oxygen, carbon, nitrogen, or hydrogen may be used. In other embodiments, wetting inhibitor layer 128 may include a fluorocarbon. Wetting inhibitor layer 128 is so termed because it inhibits the wetting of a solder material along a sidewall of metallic pillar 120 as will be described herein. Wetting inhibitor layer 128 may include a thickness, i.e., height, of approximately 0.1 µm to approximately 6.0 µm, or more specifically, approximately 0.1 µm to approximately 0.5 µm. Wetting inhibitor layer 128 may include a width, i.e., horizontal width, of approximately 2.0 µm to approximately 6.0 µm. However, wetting inhibitor layer 128 is not limited to such a thickness and the thickness of wetting inhibitor layer 128 may be customized without departing from aspects of the disclosure.

Figure 2:
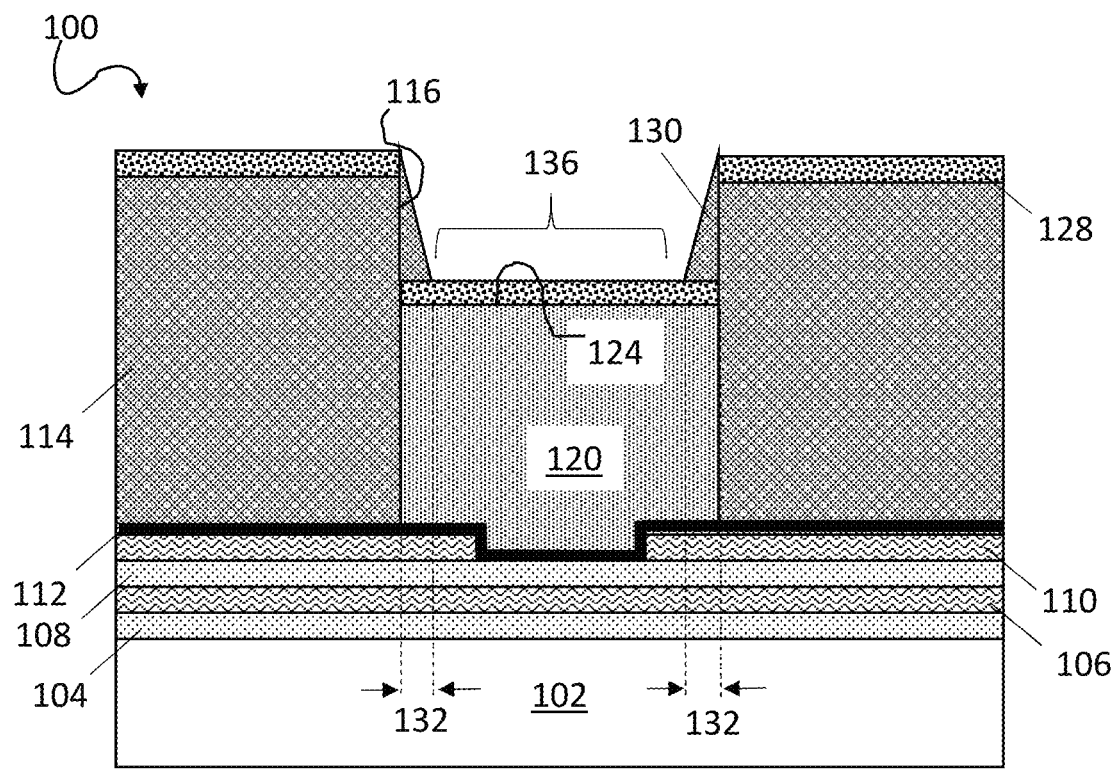
Figure 3:
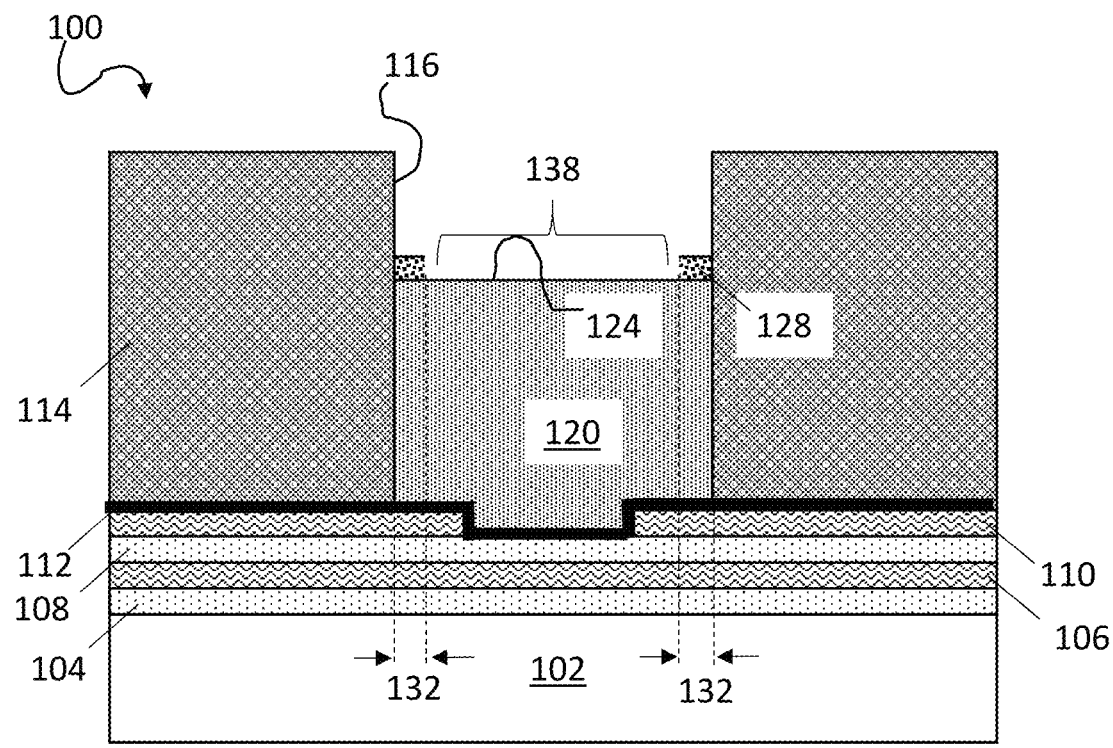

Turning to FIG. 2, another photoresist 130 may be formed over wetting inhibitor layer 128 and patterned such that wetting inhibitor layer 128 that is lining a periphery 132 of upper surface 124 of metallic pillar 120 is covered by photoresist 130 and a central portion 136 of wetting inhibitor layer 128 is exposed. As shown in FIG. 3, the exposed central portion 136 (FIG. 2) of wetting inhibitor layer 128 may be removed, e.g., by etching, to expose a central portion 138 of upper surface 124 of metallic pillar 120 thereunder. However, wetting inhibitor layer 128 that is lining periphery 132 of upper surface 124 of metallic pillar 120 remains. That is, wetting inhibitor layer 128 lining periphery 132 remains since it was covered by photoresist 130 and central portion 136 of wetting inhibitor layer 128 is removed since it was not covered by photoresist during etching. Further, photoresist 130 may be removed to expose wetting inhibitor layer 128 lining periphery 132 of upper surface 124 of metallic pillar 120.

Figure 4:
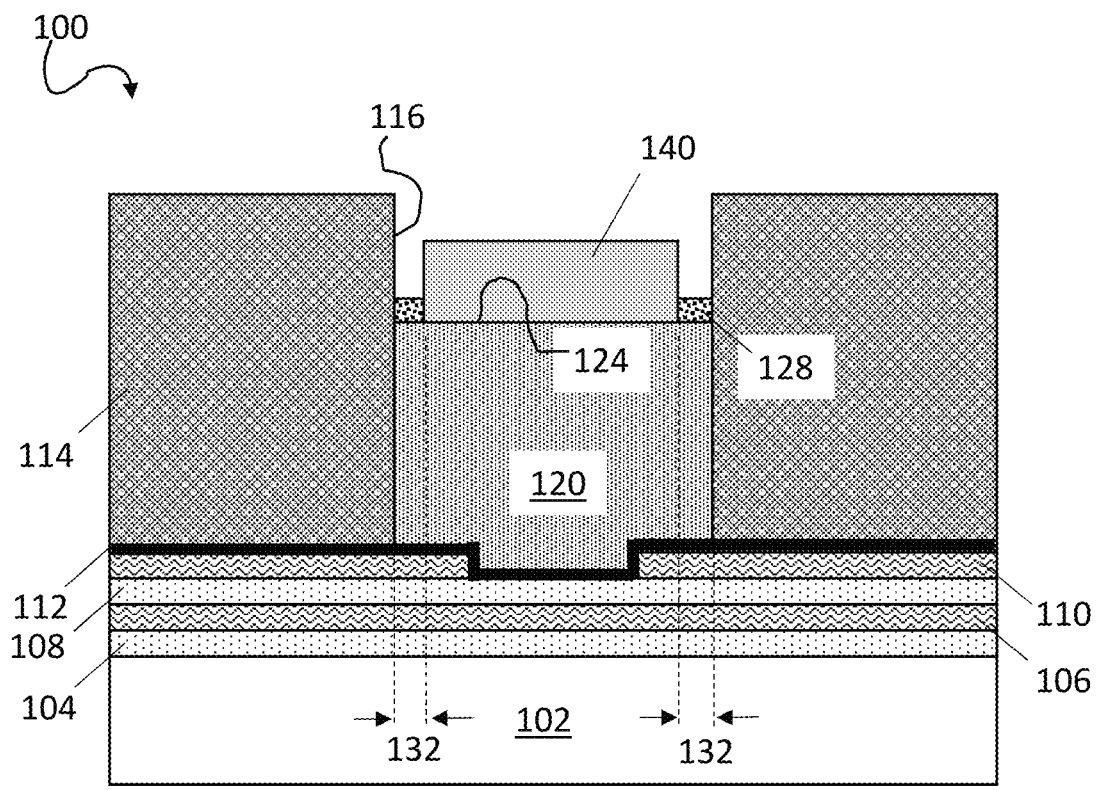
Figure 5:
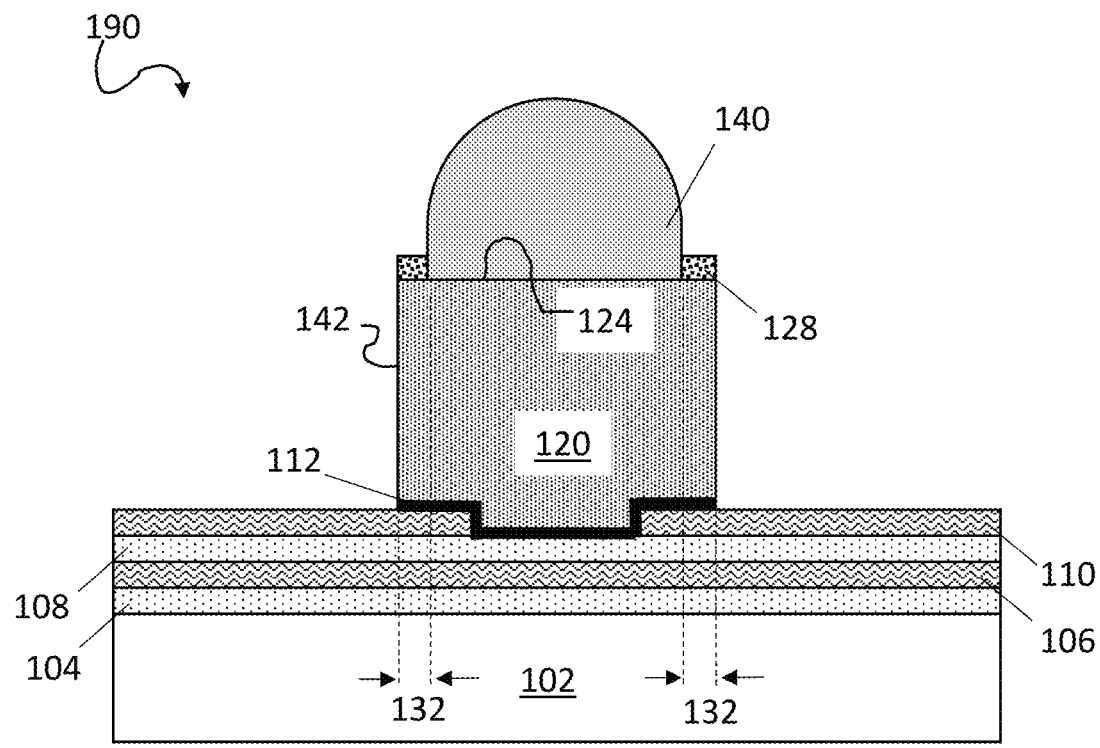

As shown in FIG. 4, a solder material 140 may be formed over upper surface 124 of metallic pillar 120. More specifically, solder material 140 may be electroplated from the exposed central portion 138 (FIG. 3) of upper surface 124 of metallic pillar 120. As shown, solder material is constrained by wetting inhibitor layer 128 about periphery 132 of upper surface 124 of metallic pillar 120. Solder material 140 may include any now known or later developed solder material such as for example, tin, lead, silver, or combinations thereof. Turning to FIG. 5, solder material 140 may be reflowed such that solder material 140 is substantially spherical (or hemispherical) in shape over upper surface 124 of metallic pillar 120 and constrained by wetting inhibitor layer 128 about periphery 132. In this way, solder material 140 is inhibited from wetting along a sidewall 142 of metallic pillar 120. That is, sidewall 142 is free of solder material 140. As used herein, "substantially" refers to largely, for the most part, entirely specified or any slight deviation which provides the same technical benefits of the invention. As also shown in FIG. 5, photoresist 114 and wetting inhibitor layer 128 over photoresist 114 may be removed, e.g., by etching, to expose portions of UBM layer 112 thereunder. Further, exposed portions of UBM layer 112 may be removed, e.g., by etching, to expose passivation layer 110 thereunder. At least a portion of UBM layer 112 may remain beneath metallic pillar 120. Additionally, IC structure 100 may undergo one or more surface cleaning processes to clean a top surface of passivation layer 110. The removal of the photoresist 114, UBM layer 112, processes may be performed prior to or after the solder reflow.

Figure 6:
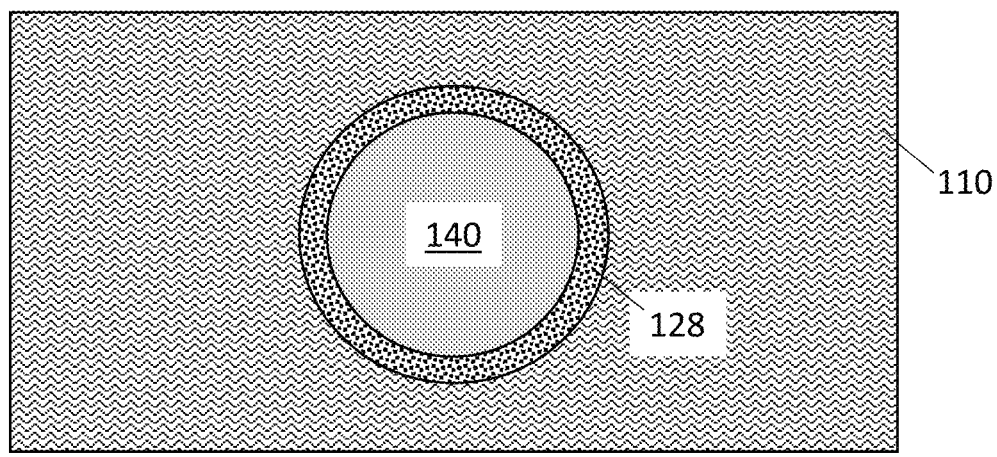
FIGS. 6-7 show top-down views of an integrated circuit structure according to embodiments of the disclosure.
Figure 7:
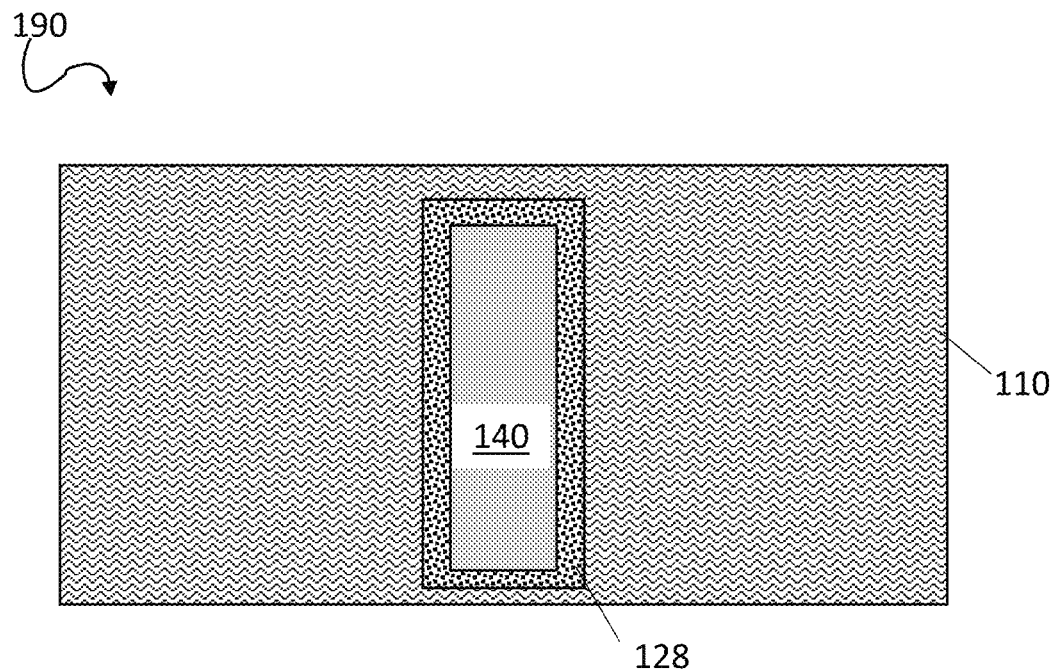
Figure 8:
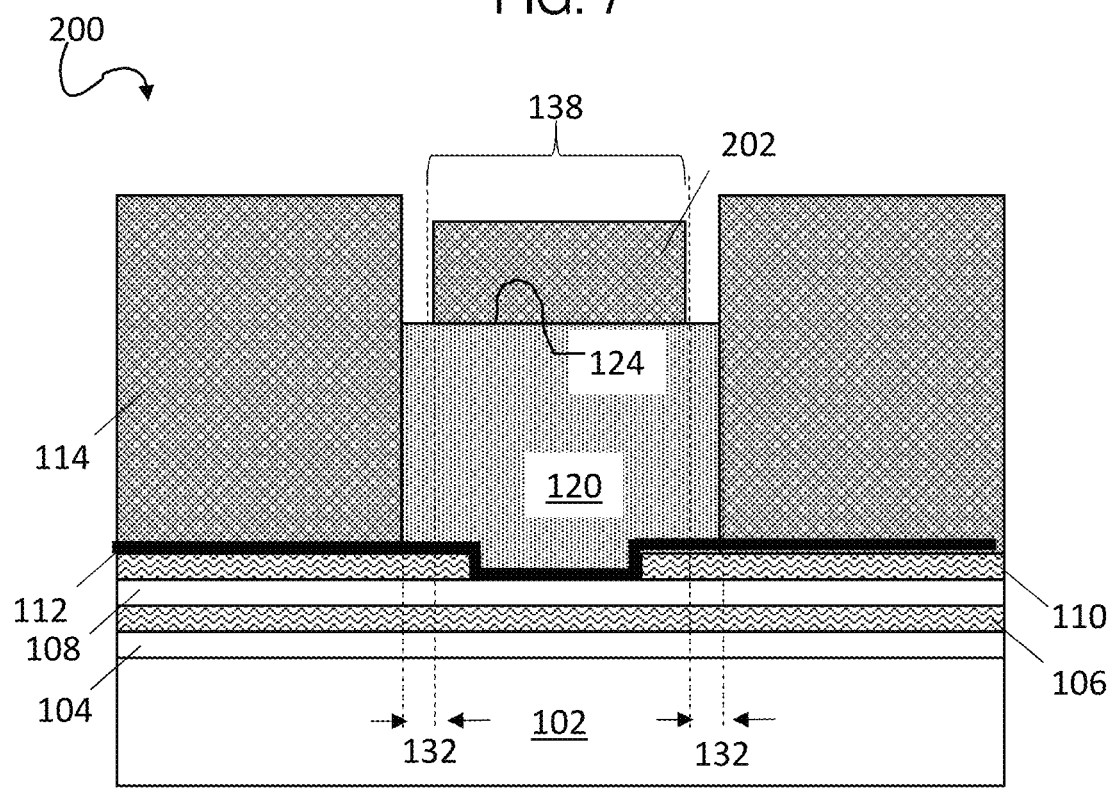
FIGS. 8-11 show cross-sectional views of an integrated circuit structure according to embodiments of the disclosure.

The resulting IC structure 190 after solder reflow as shown in FIG. 5 can include metallic pillar 120 over substrate 102. Metallic pillar may 120 include upper surface 124. Wetting inhibitor layer 128 may be disposed about periphery 132 of upper surface 124 of metallic pillar 120. Solder material 140 may be disposed over central portion 138 (FIG. 3) of upper surface 124 of metallic pillar 120. Solder material 140 may be disposed within and constrained by wetting inhibitor layer 128 about periphery 132. FIGS. 6-7 show top-down views of IC structure 190. As shown in FIG. 6, wetting inhibitor layer 128 may define an annular ring over metallic pillar 120 (FIG. 5). As shown in FIG. 7, wetting inhibitor layer may define a polygonal frame over metallic pillar 120 (FIG. 5). Wetting inhibitor layer 128 may define any shape for constraining solder material 140 and preventing solder material 140 from wetting about sidewall 142 of metallic pillar 120. The shape of the frame or ring defined by wetting inhibitor layer 128 may be designed by conventional photolithographic techniques.

FIGS. 8-11 show another embodiment of the disclosure. Starting with FIG. 8, preliminary IC structure 200 is shown. IC structure 200 is similar to IC structure 100 (FIG. 1) in that IC structure 200 includes substrate 102, conductive layers 104, 108, insulator layer 106, passivation layer 110, UBM layer 112, photoresist 114, and metallic pillar 120. Redundant explanation of these structures and the forming thereof has been omitted for brevity. IC structure 200 differs from IC structure 100 in that, instead of forming wetting inhibitor layer 128 over upper surface 124 of metallic pillar 120 and photoresist 114 as shown in FIG. 1, photoresist 202 may be formed over metallic pillar 120 and photoresist 114. Photoresist 202 may be patterned such that central portion 138 of upper surface 124 of metal pillar 120 is covered by photoresist 202 and periphery 132 of upper surface 124 of metal pillar 120 is exposed.

Figure 9:
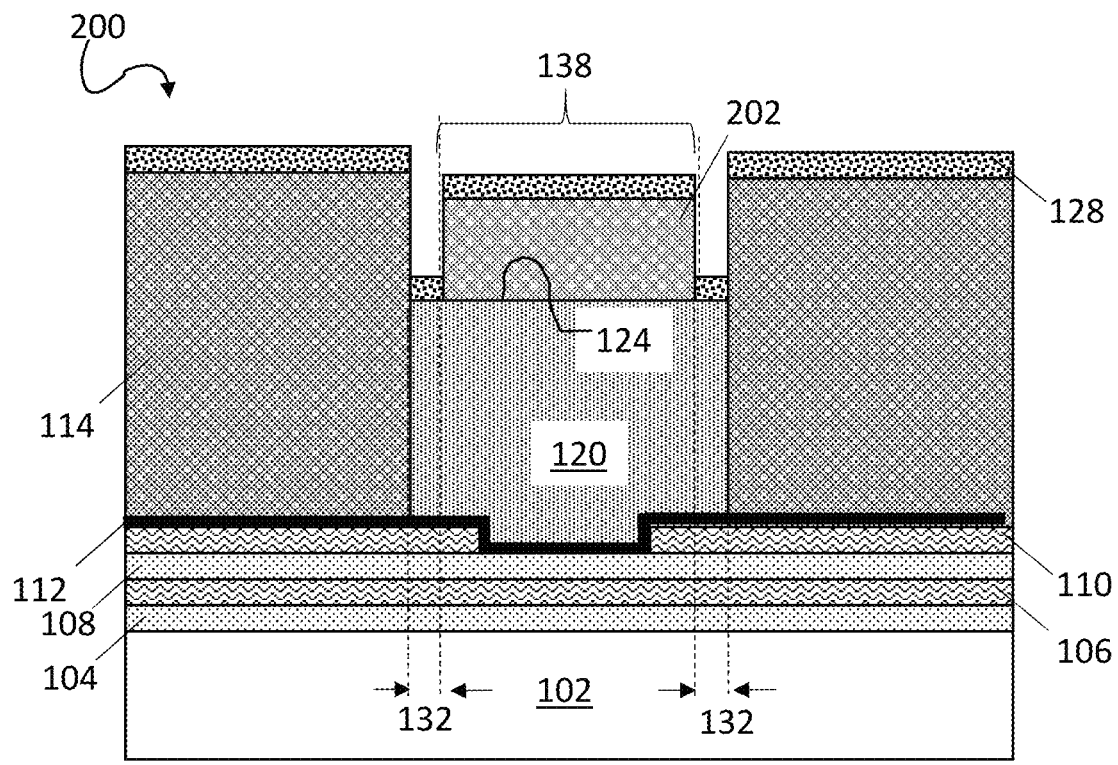
Figure 10:
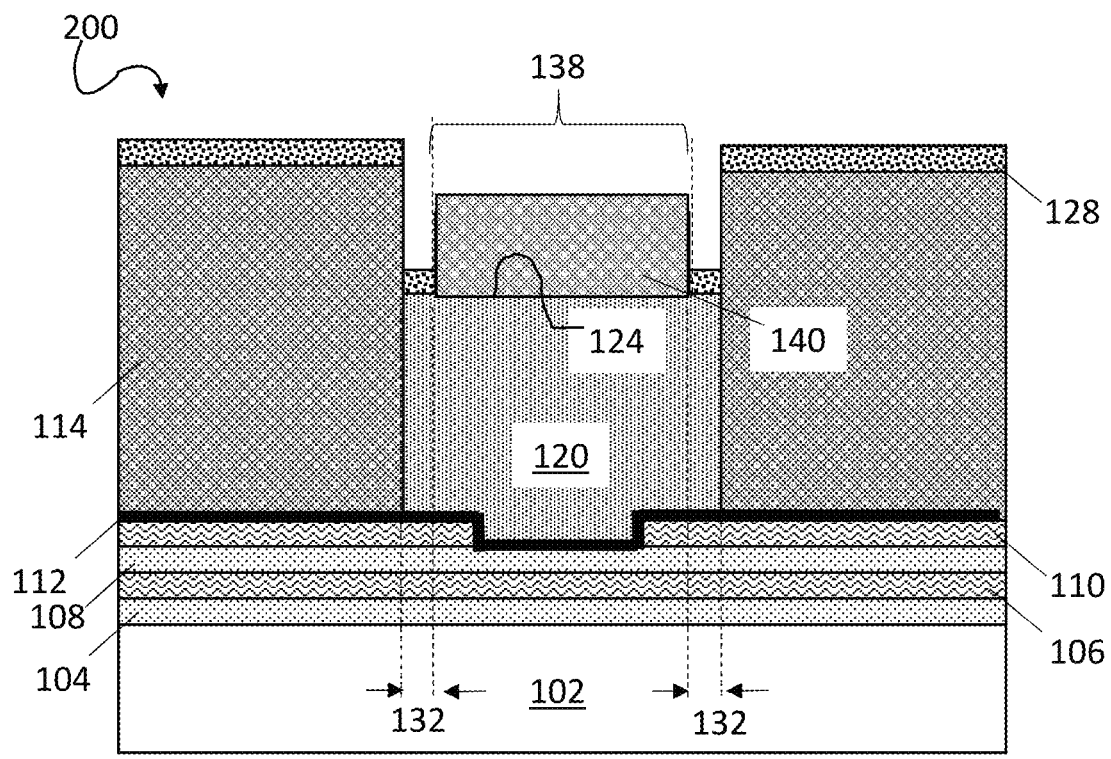
Figure 11:
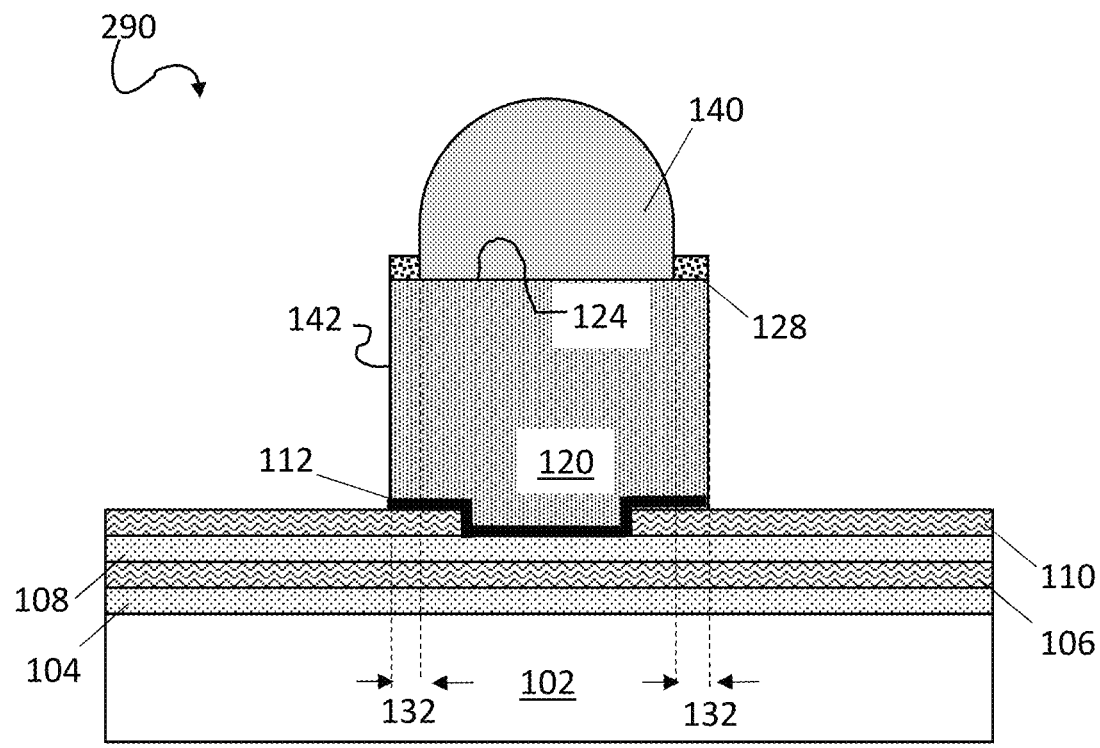
Figure 12:
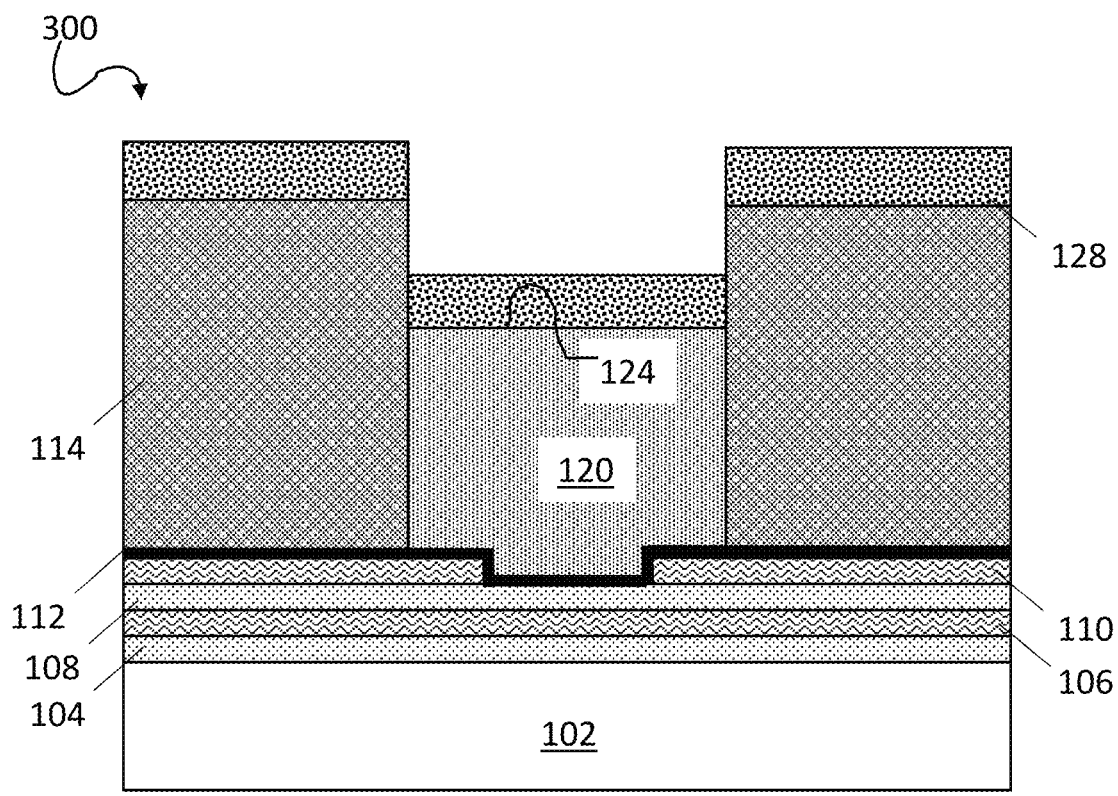
FIGS. 12-15 show cross-sectional views of an integrated circuit structure according to embodiments of the disclosure.

Turning to FIG. 9, a wetting inhibitor layer 128 may be formed, e.g., deposited, over photoresists 114, 202 and exposed periphery 132 of metallic pillar 120. Wetting inhibitor layer 128 may include any of the materials discussed for wetting inhibitor layer 128. After wetting inhibitor layer 128 is formed, photoresist 202 may be removed from central portion 138 of upper surface 124 of metallic pillar 120 to expose central portion 138 of upper surface 124 of metallic pillar 120. Further, a solder material 140 may be electroplated from the exposed central portion 138 of metallic pillar 120 such that solder material 140 is constrained by wetting inhibitor layer 128 as shown in FIG. 10. Turning to FIG. 11, solder material 140 may be reflowed such that solder material 140 is substantially spherical (or hemispherical) in shape in shape over upper surface 124 of metallic pillar 120 and constrained by wetting inhibitor layer 128 about periphery 132. In this way, solder material 140 is inhibited from wetting along a sidewall 142 of metallic pillar 120. That is, sidewall 142 is free of solder material 140. As also shown in FIG. 11, photoresist 114 and wetting inhibitor layer 128 over photoresist 114 may be removed to expose portions of UBM layer 112 thereunder. Further, exposed portions of UBM layer 112 may be removed, e.g., by etching, to expose passivation layer 110 thereunder. At least a portion of UBM layer 112 may remain beneath metallic pillar 120. Additionally, IC structure 200 may undergo one or more surface cleaning processes to clean a top surface of passivation layer 110. The removal of the photoresist 114, UBM layer 112, processes may be performed prior to or after the solder reflow.

The resulting IC structure 290 after solder reflow as shown in FIG. 11 can include metallic pillar 120 over substrate 102. Metallic pillar may 120 include upper surface 124. Wetting inhibitor layer 128 may be disposed about periphery 132 of upper surface 124 of metallic pillar 120. Solder material 140 may be disposed over central portion 138 (FIG. 10) of upper surface 124 of metallic pillar 120. Solder material 140 may be disposed within and constrained by wetting inhibitor layer 128 about periphery 132. As discussed herein, wetting inhibitor layer 128 may define an annular ring or a polygonal frame over metallic pillar 120 depending on the shaped of metal pillar 120. Wetting inhibitor layer 128 may define any shape for constraining solder material 140 and preventing solder material 140 from wetting about sidewall 142 of metallic pillar 120. The shape of the frame or ring defined by wetting inhibitor layer 128 may be designed by conventional photolithographic techniques.

Figure 13:
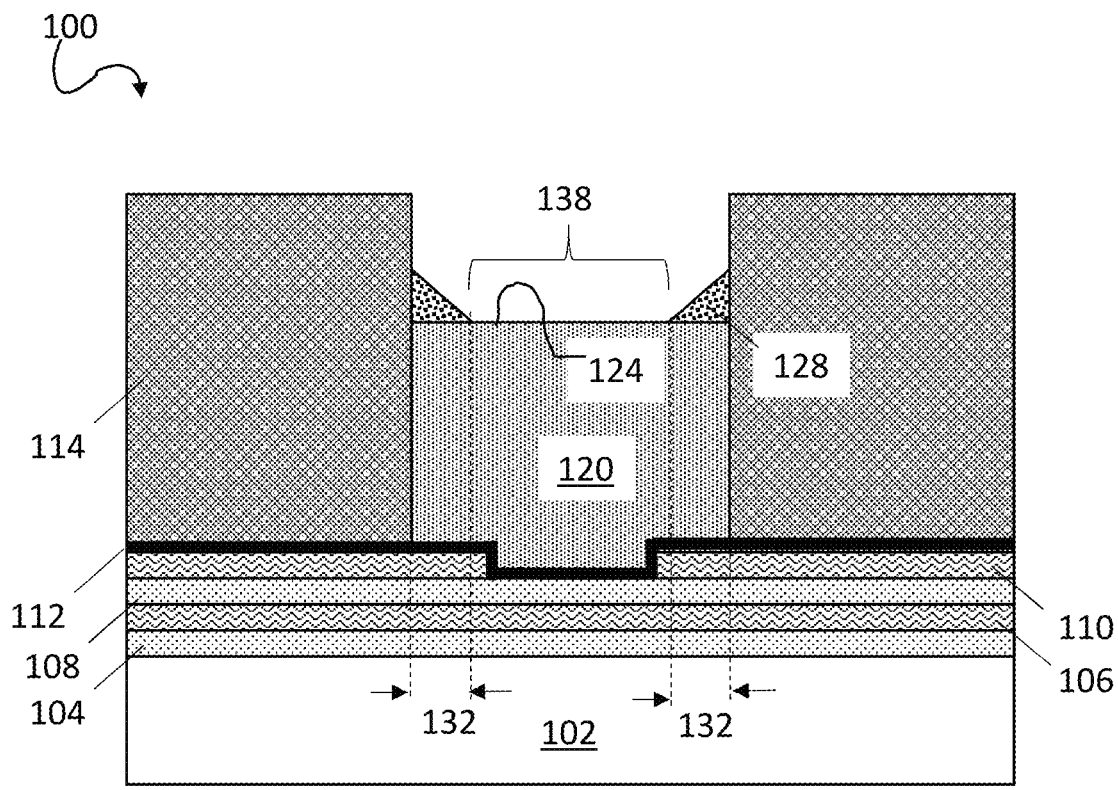

FIGS. 12-15 show another embodiment of the disclosure. This embodiment differs from the embodiment of FIGS. 1-4 in that instead of forming photoresist 130 (FIG. 2) to define wetting inhibitor layer 128 about a periphery of metallic pillar 120, an anisotropic etching can be used to define wetting inhibitor layer 128 about a periphery of metallic pillar 120. Starting with FIG. 12, preliminary IC structure 300 is shown. IC structure 300 is similar to IC structure 100 (FIG. 1) in that IC structure 300 includes substrate 102, conductive layers 104, 108, insulator layers 106, 110, photoresist 114, metallic pillar 120, and wetting inhibitor layer 128. Redundant explanation of these structures and the forming thereof has been omitted for brevity. IC structure 300 may be substantially the same as IC structure 100, or alternatively, IC structure 300 may differ from IC structure 100 in that, the forming of wetting inhibitor layer 128 over upper surface 124 of metallic pillar 120 and photoresist 114 is thicker than that which is formed in the embodiment of FIG. 1. Turning to FIG. 13, an anisotropic plasma etch may be performed on wetting inhibitor layer 128 such that a central portion 138 of upper surface 124 of metallic pillar 120 is exposed and periphery 132 of metallic pillar 120 remains covered by wetting inhibitor layer 128.

Figure 14:
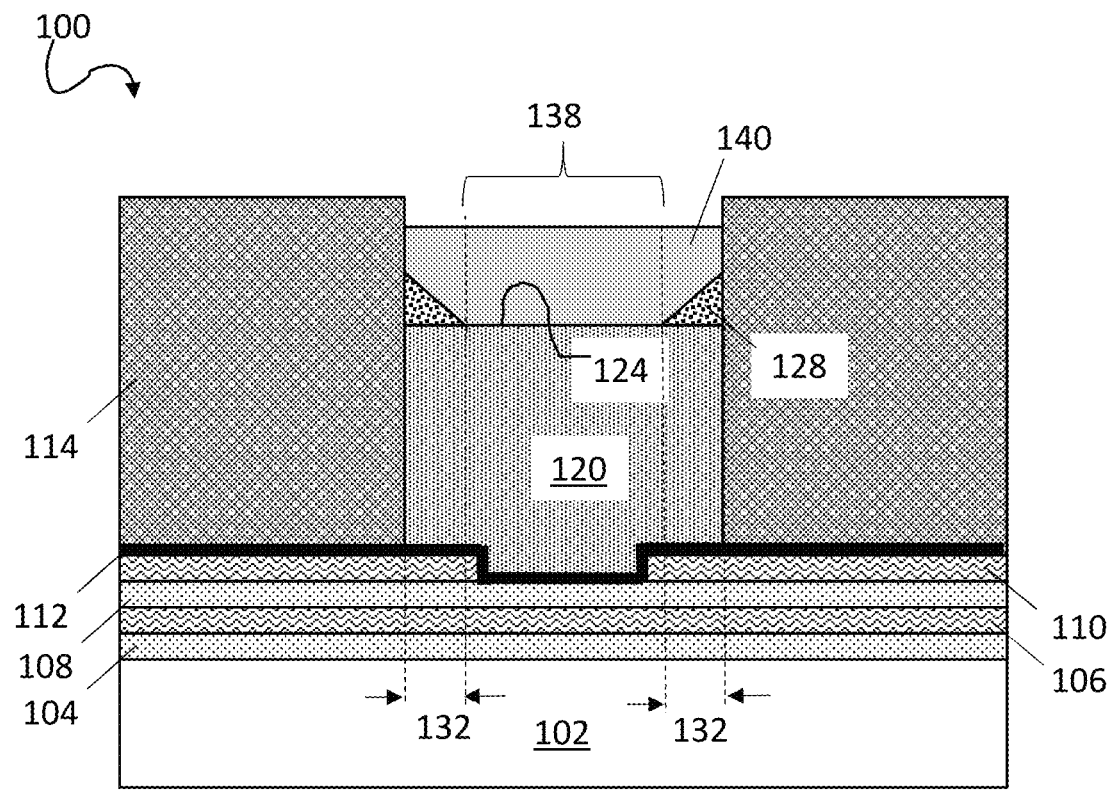
Figure 15:
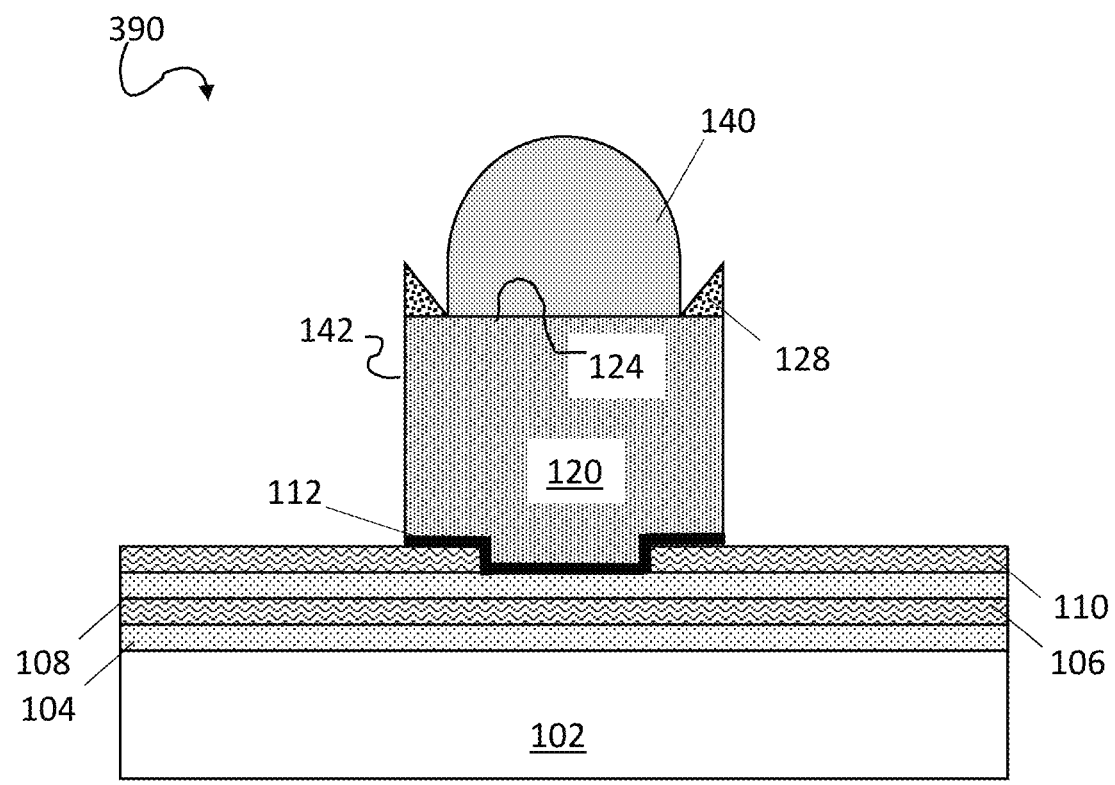

As shown in FIG. 14, after the anisotropic plasma etch, solder material 140 may be formed by electroplating solder material 140 from the exposed central portion 138 of upper surface 124 of metallic pillar 120 such that solder material 140 is constrained by wetting inhibitor layer 128. Further, as shown in FIG. 15, the process may continue with reflowing solder material 140 such that solder material 140 is substantially spherical (or hemispherical) in shape and constrained by wetting inhibitor layer 128 about periphery 132 of upper surface 124 of metallic pillar 120. In this way, solder material 140 is inhibited from wetting along a sidewall 142 of metallic pillar 120. That is, sidewall 142 is free of solder material 140. As also shown in FIG. 15, photoresist 114 and wetting inhibitor layer 128 over photoresist 114 may be removed to expose portions of UBM layer 112 thereunder. Further, exposed portions of UBM layer 112 may be removed, e.g., by etching, to expose passivation layer 110 thereunder. At least a portion of UBM layer 112 may remain beneath metallic pillar 120. Additionally, IC structure 300 may undergo one or more surface cleaning processes to clean a top surface of passivation layer 110. The removal of the photoresist 114, UBM layer 112, processes may be performed prior to or after the solder reflow.

The resulting structure 390 after solder reflow as shown in FIG. 15 can include metallic pillar 120 over substrate 102. Metallic pillar may 120 include upper surface 124. Wetting inhibitor layer 128 may be disposed about periphery 132 of upper surface 124 of metallic pillar 120. Solder material 140 may be disposed over central portion 138 (FIG. 14) of upper surface 124 of metallic pillar 120. Solder material 140 may be disposed within and constrained by wetting inhibitor layer 128 about periphery 132 of upper surface 124 of metallic pillar 120. As discussed herein, wetting inhibitor layer 128 may define an annular ring or a polygonal frame over metallic pillar 120 depending on the shaped of metallic pillar 120. Wetting inhibitor layer 128 may define any shape for constraining solder material 140 and preventing solder material 140 from wetting about sidewall 142 of metallic pillar 210. The shape of the frame or ring defined by wetting inhibitor layer 128 may be designed by conventional photolithographic techniques.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially" refers to largely, for the most part, entirely specified or any slight deviation which provides the same technical benefits of the invention.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit structure for joining wafers, the integrated circuit structure comprising:
    a metallic pillar over a substrate, the metallic pillar including an upper surface;
    a wetting inhibitor layer about a periphery of the upper surface of the metallic pillar,
    wherein the wetting inhibitor layer includes a periphery with a first thickness and an inner edge with a second thickness, wherein the first thickness is greater than the second thickness; and
    a solder material over the upper surface of the metallic pillar, the solder material being within and constrained by the wetting inhibitor layer.

2. The integrated circuit structure of claim 1, wherein the wetting inhibitor layer includes a dielectric or a fluorocarbon.

3. The integrated circuit structure of claim 1, wherein the metallic pillar includes at least one of copper or nickel.

4. The integrated circuit structure of claim 1, wherein the wetting inhibitor layer includes a width of approximately 2.0 micrometers (μm) to approximately 6.0 μm.

5. The integrated circuit structure of claim 1, wherein a sidewall of the metallic pillar is free of the solder material.

6. The integrated circuit of claim 1, wherein the metallic pillar includes a plurality of layers.

7. The integrated circuit of claim 1, wherein an upper surface of the metallic pillar is substantially circular.

8. The integrated circuit structure of claim 7, wherein the wetting inhibitor layer defines an annular ring over the metallic pillar.

9. The integrated circuit of claim 8, wherein a top surface of the solder material is substantially hemispherical in shape.

10. The integrated circuit of claim 1, wherein an upper surface of the metallic pillar is substantially polygonal.

11. The integrated circuit structure of claim 10, wherein the wetting inhibitor layer defines a polygonal frame over the metallic pillar.

12. The integrated circuit structure of claim 11, wherein an upper surface of the solder material has a substantially convex shape.

13. An integrated circuit structure for joining wafers, the integrated circuit structure comprising:
    a metallic pillar over a substrate, the metallic pillar including an upper surface;
    a wetting inhibitor layer about a periphery of the upper surface of the metallic pillar, the wetting inhibitor layer defining an annular ring or a polygonal frame over the metallic pillar; and
    a solder material over the upper surface of the metallic pillar, the solder material being within and constrained by the wetting inhibitor layer, wherein a sidewall of the metallic pillar is free of the solder material.

14. The integrated circuit structure of claim 13, wherein the wetting inhibitor layer includes a dielectric or a fluorocarbon, and wherein the metallic pillar includes at least one of: copper or nickel, and wherein the solder material includes at least one of: tin, silver, or copper.

15. The integrated circuit structure of claim 13, wherein the wetting inhibitor layer includes a width of approximately 2.0 micrometers (μm) to approximately 6.0 μm.

16. The integrated circuit structure of claim 13, wherein an upper surface of the solder material has a substantially convex shape.

17. The integrated circuit of claim 13, wherein the wetting inhibitor layer includes a periphery with a first thickness and an inner edge with a second thickness, wherein the first thickness is greater than the second thickness.

18. An integrated circuit structure for joining wafers, the integrated circuit structure comprising:
    a metallic pillar over a substrate, the metallic pillar including an upper surface;
    a wetting inhibitor layer about a periphery of the upper surface of the metallic pillar, the wetting inhibitor layer defining an annular ring or a polygonal frame over the metallic pillar, the wetting inhibitor layer including:
        a width of approximately 2.0 micrometers (μm) to approximately 6.0 μm;
        a periphery with a first thickness; and
        an inner edge with a second thickness, wherein the first thickness is greater than the second thickness; and
    a solder material over the upper surface of the metallic pillar, the solder material being within and constrained by the wetting inhibitor layer and the solder material including a top surface having a substantially convex shape, wherein a sidewall of the metallic pillar is free of the solder material.

19. The integrated circuit structure of claim 18, wherein the metallic pillar includes at least one of: copper or nickel, wherein the wetting inhibitor layer includes a dielectric or a fluorocarbon, and wherein the solder material includes at least one of: tin, silver, or copper.

* * * * *